US009355881B2

(12) United States Patent
Goller et al.

(10) Patent No.: US 9,355,881 B2
(45) Date of Patent: May 31, 2016

(54) SEMICONDUCTOR DEVICE INCLUDING A DIELECTRIC MATERIAL

(71) Applicant: Infineon Technologies AG, Neubiberg (DE)

(72) Inventors: Bernhard Goller, Villach (AT);
Eva-Maria Hess, Gremsdorf (DE);
Edward Fuergut, Dasing (DE);
Christian Schweiger, Pentling (DE)

(73) Assignee: Infineon Technologies AG, Neubiberg (DE)

( * ) Notice: Subject to any disclaimer, the term of this patent is extended or adjusted under 35 U.S.C. 154(b) by 173 days.

(21) Appl. No.: 14/182,689

(22) Filed: Feb. 18, 2014

(65) Prior Publication Data
US 2015/0235890 A1 Aug. 20, 2015

(51) Int. Cl.
*H01L 21/683* (2006.01)
*H01L 21/268* (2006.01)
*H01L 21/304* (2006.01)
*H01L 21/762* (2006.01)
*H01L 21/78* (2006.01)
*H01L 23/00* (2006.01)
*H01L 21/56* (2006.01)
*H01L 23/31* (2006.01)

(52) U.S. Cl.
CPC .......... *H01L 21/6835* (2013.01); *H01L 21/268* (2013.01); *H01L 21/304* (2013.01); *H01L 21/76251* (2013.01); *H01L 21/78* (2013.01); *H01L 24/02* (2013.01); *H01L 21/568* (2013.01); *H01L 23/3114* (2013.01); *H01L 2221/6834* (2013.01); *H01L 2221/68318* (2013.01); *H01L 2221/68327* (2013.01); *H01L 2221/68381* (2013.01); *H01L 2224/0231* (2013.01); *H01L 2924/06* (2013.01); *H01L 2924/0665* (2013.01); *H01L 2924/12042* (2013.01); *H01L 2924/181* (2013.01); *H01L 2924/201* (2013.01); *H01L 2924/2011* (2013.01); *H01L 2924/2064* (2013.01); *H01L 2924/20108* (2013.01); *H01L 2924/20109* (2013.01); *H01L 2924/20111* (2013.01); *H01L 2924/20641* (2013.01); *H01L 2924/20642* (2013.01)

(58) Field of Classification Search
CPC .......... H01L 2221/68318; H01L 2221/68327; H01L 2221/68345; H01L 2221/6835; H01L 2221/68381; H01L 2221/68386; H01L 21/76251; H01L 21/76254; H01L 21/76256; H01L 21/76259; H01L 21/6835; H01L 21/6251
See application file for complete search history.

(56) References Cited

U.S. PATENT DOCUMENTS 6,762,510 B2 * 7/2004 Fock ................ H01L 23/49855
257/787
7,462,552 B2 12/2008 Tong et al.
7,883,991 B1 2/2011 Wu et al.
8,221,571 B2 7/2012 Hong et al.
(Continued)

*Primary Examiner* — Jose R Diaz
(74) *Attorney, Agent, or Firm* — Dicke, Billig & Czaja, PLLC

(57) ABSTRACT

A method for manufacturing a semiconductor device includes providing a carrier and a semiconductor wafer having a first side and a second side opposite to the first side. The method includes applying a dielectric material to the carrier or the semiconductor wafer and bonding the semiconductor wafer to the carrier via the dielectric material. The method includes processing the semiconductor wafer and removing the carrier from the semiconductor wafer such that the dielectric material remains on the semiconductor wafer to provide a semiconductor device comprising the dielectric material.

22 Claims, 8 Drawing Sheets

(56) References Cited

U.S. PATENT DOCUMENTS

| | | |
|---|---|---|
| 8,236,669 B2 | 8/2012 | Hong et al. |
| 8,580,070 B2 | 11/2013 | Fuergut et al. |
| 8,970,045 B2 * | 3/2015 | Sadaka ................ H01L 21/486 257/774 |
| 2008/0302481 A1 | 12/2008 | Berger et al. |
| 2010/0263794 A1 * | 10/2010 | George ............. H01L 21/67092 156/707 |
| 2010/0330788 A1 | 12/2010 | Yu et al. |
| 2013/0048224 A1 | 2/2013 | George et al. |
| 2013/0168850 A1 | 7/2013 | Samoilov et al. |
| 2015/0228849 A1 * | 8/2015 | Zou ................... H01L 21/76894 438/28 |

* cited by examiner

SEMICONDUCTOR DEVICE INCLUDING A DIELECTRIC MATERIAL

BACKGROUND

A semiconductor wafer may be attached to a temporary wafer carrier to support the semiconductor wafer during processing. The wafer carrier reduces or eliminates bowing of the semiconductor wafer during processing, enables thinning of the semiconductor wafer and other backside processes, and simplifies handling of the semiconductor wafer, particularly for ultrathin wafers. Once processing of the semiconductor wafer is complete, the wafer carrier is removed. In other processes, the wafer carrier is not removed and becomes a part of the final semiconductor devices fabricated from the semiconductor wafer. Typically, a temporary adhesive layer is used to attach the semiconductor wafer to the wafer carrier. The temporary adhesive layer, however, is temperature sensitive. For example, a typical temporary adhesive layer has a processing limit of two hours at 250° C. Therefore, the processes that follow the bonding of the semiconductor wafer to the wafer carrier are adjusted to stay within the temperature limits of the adhesive layer. The adjusted processes have substantial limitations with regard to quality, yield, performance, and productivity.

For these and other reasons, there is a need for the present invention.

SUMMARY

One embodiment provides a method for manufacturing a semiconductor device including providing a carrier and a semiconductor wafer having a first side and a second side opposite to the first side. The method includes applying a dielectric material to the carrier or the semiconductor wafer and bonding the semiconductor wafer to the carrier via the dielectric material. The method includes processing the semiconductor wafer and removing the carrier from the semiconductor wafer such that the dielectric material remains on the semiconductor wafer to provide a semiconductor device comprising the dielectric material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements.

Figure 1A:
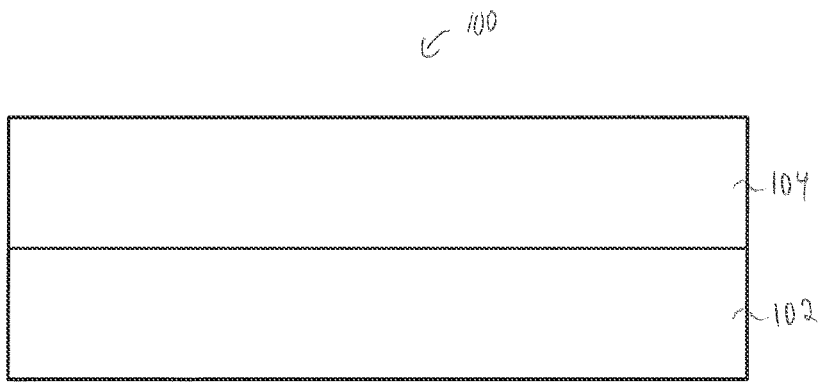
FIG. 1A illustrates a cross-sectional view of one embodiment of a semiconductor device.

FIG. 1A illustrates a cross-sectional view of one embodiment of a semiconductor device 100. Semiconductor device 100 includes a semiconductor chip 102 and a dielectric material layer 104 over the semiconductor chip. Dielectric material layer 104 is used during the fabrication of semiconductor device 100 to bond the semiconductor wafer, from which semiconductor chip 102 is fabricated, to a wafer carrier for processing. Once processing of the semiconductor wafer is complete, the wafer carrier is removed and the semiconductor wafer is singulated to provide semiconductor chip 102. Dielectric material layer 104 remains on semiconductor chip 102 to provide at least a portion of semiconductor device 100.

Dielectric material layer 104 protects the surface of semiconductor chip 102. Dielectric material layer 104 is composed of a polymer, epoxy (e.g., mold compound), silicone, polyimide, cyanester, bismalinimide (BMI), or other suitable dielectric material that can be bonded to a wafer carrier and provide at least a portion of semiconductor device 100. The dielectric material may include a filler material, such as $SiO_2$, $Al_2O_3$, $Si_3N_4$, BrN, SiC, AlN, diamond, or other suitable material. The dielectric material may be applied as a liquid, granular, or sheet including a fine filler or glass fibers or a combination thereof. In one example, dielectric material 104 is a thermally conductive insulating material. Semiconductor chip 102 is a power semiconductor chip, such as a transistor or diode, a logic semiconductor chip, a communication semiconductor chip, or other suitable semiconductor chip.

Figure 1B:
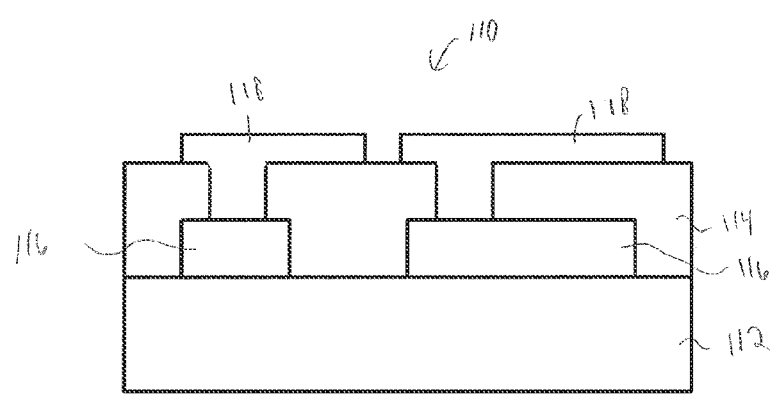
FIG. 1B illustrates a cross-sectional view of another embodiment of a semiconductor device.

FIG. 1B illustrates a cross-sectional view of another embodiment of a semiconductor device 110. Semiconductor device 110 includes a semiconductor chip 112, a dielectric material layer 114, metal contacts 116, and redistribution layer (RDL) 118. RDL 118 is electrically coupled to semiconductor chip 112 through metal contacts 116. Prior to RDL 118 being formed, dielectric material layer 114 is used during the fabrication of semiconductor device 110 to bond the semiconductor wafer, from which semiconductor chip 112 is fabricated, to a wafer carrier for processing.

Once processing of the semiconductor wafer is complete, the wafer carrier is removed and the semiconductor wafer is singulated to provide semiconductor chip 112 with metal contacts 116. Dielectric material layer 114 remains on semiconductor chip 112 and metal contacts 116 to provide at least a portion of semiconductor device 110. Dielectric material layer 114 protects the surface of semiconductor chip 112. Dielectric material layer 114 is structured to provide openings to metal contacts 116. RDL 118 is formed in the openings and on the upper surface of dielectric material layer 114 to provide semiconductor device 110. RDL 118 and metal contacts 116 are composed of Cu, Al, Au, Ag, W, and/or other suitable metals.

Dielectric material layer 114 is composed of a polymer, epoxy (e.g., mold compound), silicone, polyimide, cyanester, bismalinimide (BMI), or other suitable dielectric material that can be bonded to a wafer carrier and provide at least a portion of semiconductor device 110. Semiconductor chip 112 is a power semiconductor chip, such as a transistor or diode, a logic semiconductor chip, a communication semiconductor chip, or other suitable semiconductor chip.

Figure 1C:
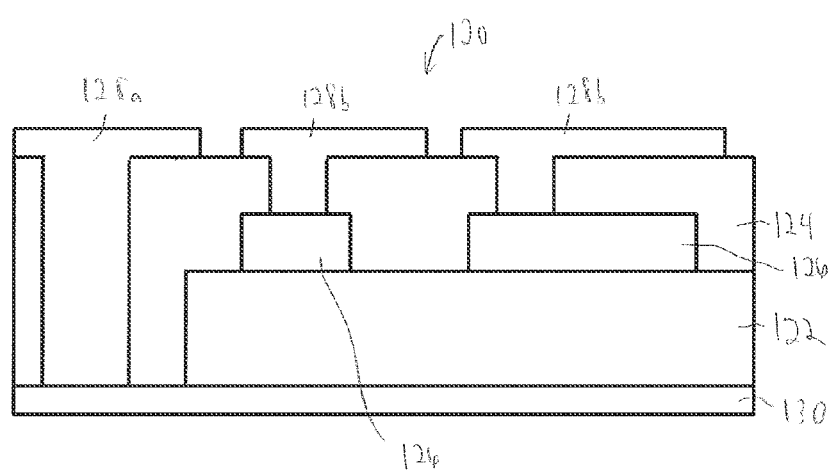
FIG. 1C illustrates a cross-sectional view of another embodiment of a semiconductor device.

FIG. 1C illustrates a cross-sectional view of another embodiment of a semiconductor device 120. Semiconductor device 120 includes a semiconductor chip 122, a dielectric material layer 124, metal contacts 126, RDL portions 128a and 128b (collectively referred to as RDL 128), and backside metal 130. RDL portion 128a is electrically coupled to backside metal 130. RDL portion 128b is electrically coupled to semiconductor chip 122 through metal contacts 126. Prior to RDL 128 being formed, dielectric material layer 124 is used during the fabrication of semiconductor device 120 to bond the semiconductor wafer, from which semiconductor chip 122 is fabricated, to a wafer carrier for processing.

Once processing of the semiconductor wafer is complete, the wafer carrier is removed and the semiconductor wafer is singulated to provide semiconductor chip 122 with metal contacts 126. In one embodiment, backside metal 130 is formed during the processing. In another embodiment, semiconductor chip 122 is attached to a metal leadframe or carrier after singulation to provide backside metal 130. Dielectric material layer 124 remains on semiconductor chip 122 and metal contacts 126 to provide at least a portion of semiconductor device 120. Dielectric material layer 124 protects the surface of semiconductor chip 122. Dielectric material layer 124 is structured to provide an opening to backside metal 130 and openings to metal contacts 126. RDL 128 is formed in the openings and on the upper surface of dielectric material layer 124 to provide semiconductor device 120. RDL 128, metal contacts 126, and backside metal 130 are composed of Cu, Al, Au, Ag, W, and/or other suitable metals.

Dielectric material layer 124 is composed of a polymer, epoxy (e.g., mold compound), silicone, polyimide, cyanester, bismalinimide (BMI), or other suitable dielectric material that can be bonded to a wafer carrier and provide at least a portion of semiconductor device 120. Semiconductor chip 122 is a power semiconductor chip having a vertical current path between contacts 126 and backside metal 130, such as a transistor or diode.

The followings FIGS. 2-7 illustrate one embodiment of a method for fabricating a semiconductor device, such as semiconductor device 100 previously described and illustrated with reference to FIG. 1A.

Figure 2:
FIG. 2 illustrates a cross-sectional view of one embodiment of a wafer carrier.

FIG. 2 illustrates a cross-sectional view of one embodiment of a wafer carrier 200. Wafer carrier 200 includes a glass wafer carrier, a resin wafer carrier, a semiconductor (e.g., silicon) wafer carrier, a ceramic wafer carrier, a metal wafer carrier, or another suitable wafer carrier that can be bonded to a semiconductor wafer using a dielectric material layer. In one example, wafer carrier 200 has a thickness between 0.2 mm and 1.0 mm. In one embodiment, wafer carrier 200 is reusable. In other embodiments, wafer carrier 200 is destroyed during the fabrication process.

Figure 3A:
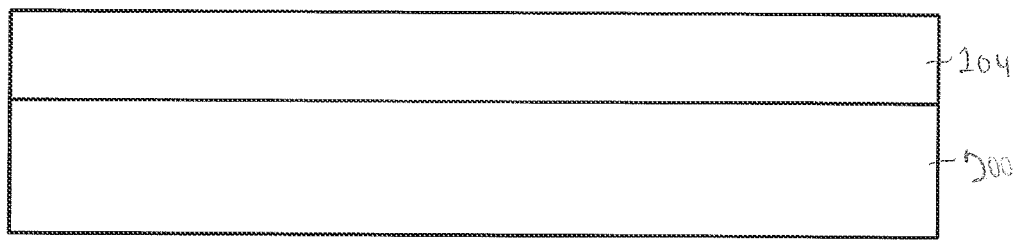
FIG. 3A illustrates a cross-sectional view of one embodiment of the wafer carrier and a dielectric material layer.

FIG. 3A illustrates a cross-sectional view of one embodiment of wafer carrier 200 and a dielectric material layer 204. A dielectric material, such as a polymer, epoxy (e.g., mold compound), silicone, polyimide, cyanester, bismalinimide (BMI), or other suitable dielectric material, is applied to the surface of wafer carrier 200 to provide dielectric material layer 204. Dielectric material layer 204 is applied to wafer carrier 200 by spin coating (e.g., for low viscosity liquids), printing (e.g., for low or medium viscosity liquids), laminating (e.g., for sheets using a printed circuit board process), encapsulating (e.g., transfer molding or compression molding using a high viscosity or high fill liquid, granular, or sheet), or other suitable process based on the selected dielectric material. For example, a polymer or epoxy may be spin coated while a mold compound may be molded onto the surface of wafer carrier 200. In one embodiment, dielectric material layer 204 is applied to have a thickness between 10 µm and 200 µm. In other embodiments, dielectric material layer 204 is applied to have a thickness greater than 200 µm, such as between 500 µm and 800 µm.

In one embodiment for a selected dielectric material, dielectric material layer 204 is subjected to a pre-bake after application to wafer carrier 200 to drive off any solvents within the dielectric material layer and/or to modify the consistency of the dielectric material layer. The pre-bake may be performed at a temperature between 60° C. and 150° C. In other embodiments for a selected dielectric material, a pre-bake is not necessary since the dielectric material does not have any solvents to drive off.

Figure 3B:
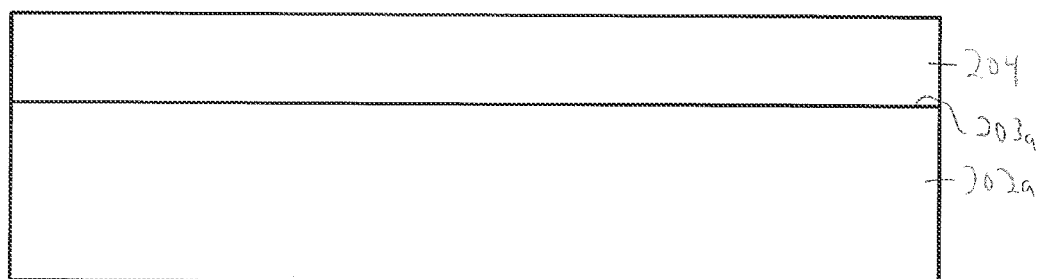
FIG. 3B illustrates a cross-sectional view of one embodiment of a semiconductor wafer and a dielectric material layer.

FIG. 3B illustrates a cross-sectional view of one embodiment of a semiconductor wafer 202a and a dielectric material layer 204. In this embodiment, dielectric material layer 204 is applied to semiconductor wafer 202a instead of to wafer carrier 200 as previously described and illustrated with reference to FIG. 3A. Semiconductor wafer 202a includes a first surface 203a on a first side of semiconductor wafer 202a and a second surface 203b on a second side of semiconductor wafer 202a opposite to the first side. In one embodiment, first surface 203a is the frontside or active surface of semiconductor wafer 202a, and second surface 203b is the backside surface of semiconductor wafer 202a. In other embodiments, first surface 203a is the backside of semiconductor wafer 202a and second surface 203b is the frontside or active surface of semiconductor wafer 202a. Dielectric material layer 204 is applied to the first surface 203a of semiconductor wafer 202a. Dielectric material layer 204 is applied to semiconductor wafer 202a in a similar manner as dielectric material layer 204 is applied to wafer carrier 200 as previously described and illustrated with reference to FIG. 3A.

While dielectric material layer 204 in FIGS. 3A and 3B is illustrated as a uniform layer, dielectric material layer 204 may not be uniform until semiconductor wafer 202a is bonded to wafer carrier 200 as described below with reference to FIG. 4. For example, a mold compound may be applied to the center of wafer carrier 200 or the center of semiconductor wafer 202a. The mold compound will spread out and form a uniform dielectric material layer during the bonding process.

Figure 4:
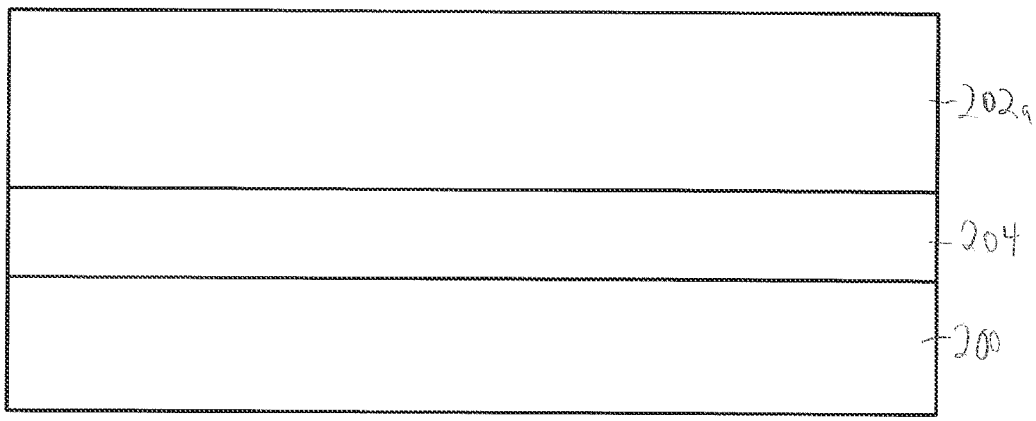
FIG. 4 illustrates a cross-sectional view of one embodiment of the wafer carrier bonded to the semiconductor wafer via the dielectric material layer.

FIG. 4 illustrates a cross-sectional view of one embodiment of wafer carrier 200 bonded to semiconductor wafer 202a via dielectric material layer 204. Semiconductor wafer 202a is bonded to wafer carrier 200 by applying pressure and heat to semiconductor wafer 202a, wafer carrier 200, and dielectric material layer 204. In one embodiment, semiconductor wafer 202a is bonded to wafer carrier 200 in a vacuum. The pressure and heat applied to semiconductor wafer 202a, wafer carrier 200, and dielectric material layer 204 is based on the selected dielectric material. In one example, semiconductor wafer 202a is bonded to wafer carrier 200 at a temperature between 100° C. and 250° C., at a pressure between 10 bar and 100 bar, and at a vacuum less than 50 millibar. After bonding, dielectric material layer 204 directly contacts semiconductor wafer 202a and directly contacts wafer carrier 200.

The bond provided by dielectric material layer 204 has a temperature stability greater than the temperature stability of typical adhesive materials used for temporarily bonding semiconductor wafers to wafer carriers. In one example, dielectric material layer 204 has a temperature stability greater than 250° C. for more than two hours. In other examples, dielectric material layer 204 has a temperature stability greater than 300° C. or 350° C. for more than two hours or greater than 400° C. or 450° C. for more than two hours. Therefore, the processes that follow the bonding of semiconductor wafer 202a to wafer carrier 200 may have higher temperatures for longer periods than if a typical adhesive material had been used for bonding.

Figure 5:
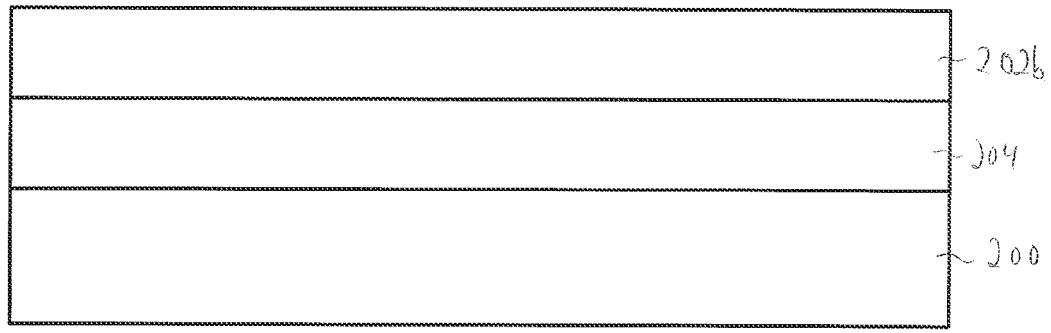
FIG. 5 illustrates a cross-sectional view of one embodiment of the semiconductor wafer bonded to the wafer carrier after processing.

FIG. 5 illustrates a cross-sectional view of one embodiment of a semiconductor wafer 202b bonded to wafer carrier 200 after processing a second side of the semiconductor wafer. The second side of wafer 202a is processed to provide processed wafer 202b. The processing can include grinding, Chemical Mechanical Polishing (CMP), chemical etching, plasma etching, implantations, oven steps, lithography layers (which may be aligned to the first side of the semiconductor wafer), laser annealing, metallization, molding, and/or other suitable processes. In one example, the processing includes thinning the semiconductor wafer by grinding or CMP to provide a semiconductor wafer 202b having a thickness less the 250 µm. The processing may include temperatures greater than 250° C. or greater than 350° C. for more than two hours without breaking down the bond between semiconductor wafer 202b and wafer carrier 200 provided by dielectric material layer 204.

Figure 6:
FIG. 6 illustrates a cross-sectional view of one embodiment of the semiconductor wafer and the dielectric material layer after removing the wafer carrier.

FIG. 6 illustrates a cross-sectional view of one embodiment of semiconductor wafer 202b and dielectric material layer 204 after removing wafer carrier 200. After processing, wafer carrier 200 is removed from dielectric material layer 204 such that dielectric material layer 204 remains on semiconductor wafer 202b. In one example, wafer carrier 200 is removed from dielectric material layer 204 by a mechanical debonding process, a chemical debonding process, or another suitable debonding process in which wafer carrier 200 is not destroyed and thus is reusable. In another example, wafer carrier 200 is removed by a grinding process or other suitable destructive process in which wafer carrier 200 is destroyed. After removing wafer carrier 200, additional processes may be performed on the first side of wafer 202b and dielectric material layer 204. In any case, however, at least a portion of dielectric material layer 204 remains on semiconductor wafer 202b.

Figure 7:
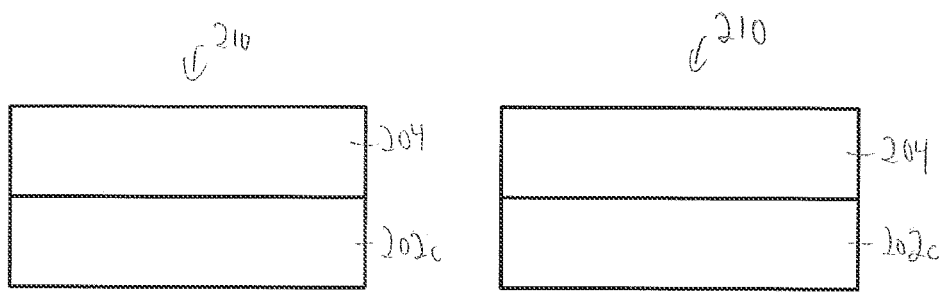
FIG. 7 illustrates a cross-sectional view of one embodiment of a plurality of semiconductor devices including a dielectric material layer after singulation.

FIG. 7 illustrates a cross-sectional view of one embodiment of a plurality of semiconductor devices 210 including dielectric material layer 204 after singulation. Semiconductor wafer 202b is singulated to provide a plurality of semiconductor devices 210 including a semiconductor chip 202c and a dielectric material layer 204 on the semiconductor chip. Semiconductor wafer 202b is singulated to provide semiconductor devices 210 by sawing, laser cutting, or other suitable process.

The followings FIGS. 8-11 illustrate another embodiment of a method for fabricating a semiconductor device after bonding a semiconductor wafer 202a to a carrier 200 as previously described and illustrated with reference to FIG. 4.

Figure 8:
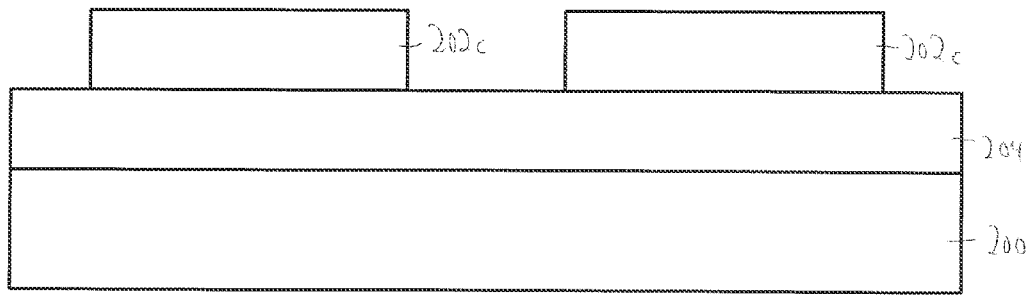
FIG. 8 illustrates a cross-sectional view of one embodiment of a plurality of semiconductor chips bonded to a wafer carrier after processing.

FIG. 8 illustrates a cross-sectional view of one embodiment of a plurality of semiconductor chips 202c bonded to wafer carrier 200 after processing the second side of the semiconductor wafer. In this embodiment, the second side of wafer 202a (FIG. 4) is processed to provide a plurality of separated semiconductor chips 202c. The processing can include grinding, CMP, chemical etching, plasma etching, implantations, oven steps, lithography layers (which may be aligned to the first side of the semiconductor wafer), laser annealing, metallization, and/or other suitable processes. In one example, the processing includes thinning the semiconductor wafer by grinding or CMP to provide semiconductor chips 202c having a thickness less the 250 μm. The processing may include temperatures greater than 250° C. or greater than 350° C. for more than two hours without breaking down the bond between semiconductor chips 202c and wafer carrier 200 provided by dielectric material layer 204.

Figure 9:
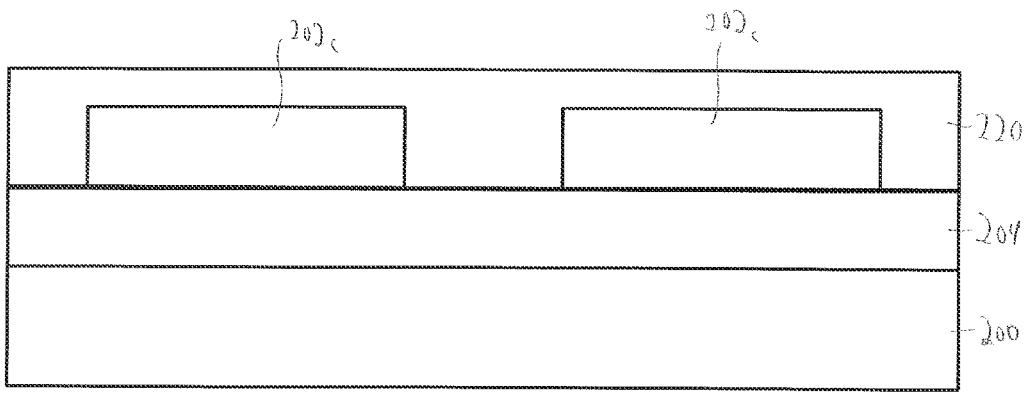
FIG. 9 illustrates a cross-sectional view of one embodiment of the plurality of semiconductor chips bonded to the wafer carrier after applying a dielectric material layer over the plurality of semiconductor chips.

FIG. 9 illustrates a cross-sectional view of one embodiment of the plurality of semiconductor chips 202c bonded to wafer carrier 200 after applying a dielectric material layer 220 over the plurality of semiconductor devices. Dielectric material layer 220 may be composed of the same dielectric material as dielectric material layer 204 or a different dielectric material. Dielectric material layer 220 is applied to the exposed portions of dielectric material layer 204 and semiconductor chips 202c by spin coating, printing, laminating, encapsulating, or other suitable process based on the selected dielectric material. For example, a polymer or epoxy may be spin coated while a mold compound may be molded onto the exposed portions of dielectric material layer 204 and semiconductor chips 202c. While FIG. 9 illustrates dielectric material layer 202 over the second surface of each semiconductor chip 202c, in other embodiments the second surface of each semiconductor chip 202c may remain exposed such that dielectric material layer 220 is only between the sidewalls of adjacent semiconductor chips 202c.

Figure 10:
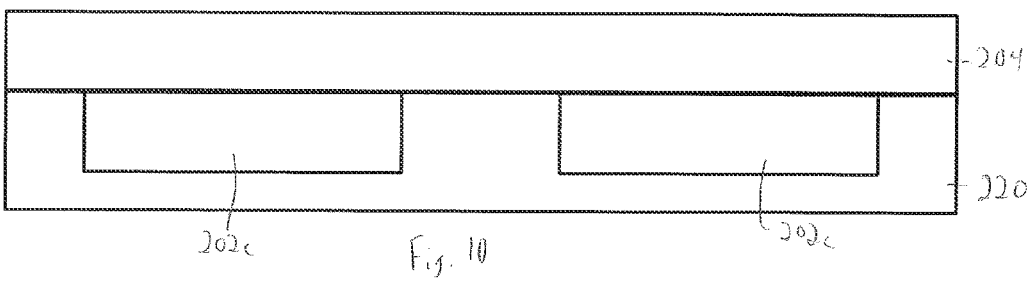
FIG. 10 illustrates a cross-sectional view of one embodiment of the plurality of semiconductor chips and the dielectric material layers after removing the wafer carrier.

FIG. 10 illustrates a cross-sectional view of one embodiment of the plurality of semiconductor chips 202c and the dielectric material layers 204 and 220 after removing wafer carrier 200. After processing, wafer carrier 200 is removed from dielectric material layer 204 such that dielectric material layer 204 remains on semiconductor chips 202c and dielectric material layer 220. In one example, wafer carrier 200 is removed from dielectric material layer 204 by a mechanical debonding process, a chemical debonding process, or another suitable debonding process in which wafer carrier 200 is not destroyed and thus is reusable. In another example, wafer carrier 200 is removed by a grinding process or other suitable destructive process in which wafer carrier 200 is destroyed. After removing wafer carrier 200, additional processes may be performed on the first side of semiconductor chips 202c and dielectric material layer 204. In any case, however, at least a portion of dielectric material layer 204 remains on semiconductor chips 202c.

Figure 11:
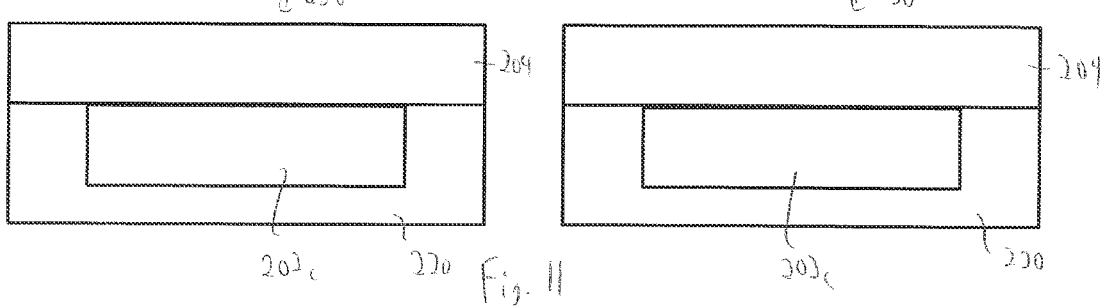
FIG. 11 illustrates a cross-sectional view of one embodiment of a plurality of semiconductor devices including dielectric material layers after singulation.

FIG. 11 illustrates a cross-sectional view of one embodiment of a plurality of semiconductor devices 230 including dielectric material layers 204 and 220 after singulation. Dielectric material layers 204 and 220 are cut between semiconductor chips 202c to provide a plurality of semiconductor devices 230 including a semiconductor chip 202c and dielectric material layers 204 and 220 on the semiconductor chip. Dielectric material layers 204 and 220 are cut by sawing, laser cutting, or other suitable process.

The followings FIGS. 12-16 illustrate another embodiment of a method for fabricating a semiconductor device, such as semiconductor device 100 previously described and illustrated with reference to FIG. 1A.

Figure 12:
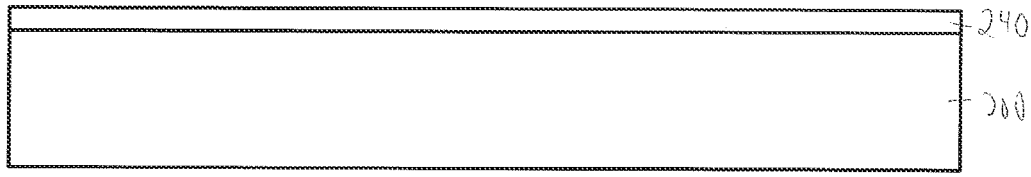
FIG. 12 illustrates a cross-sectional view of one embodiment of a wafer carrier and a sacrificial release material layer.

FIG. 12 illustrates a cross-sectional view of one embodiment of a wafer carrier 200 and a sacrificial release material layer 240. In this embodiment, wafer carrier 200 is a glass wafer carrier or another suitable transparent wafer carrier. A sacrificial release material is applied to wafer carrier 200 using a suitable deposition or printing process to provide sacrificial release layer 240. In one example, sacrificial release layer 240 is applied to a thickness of 1 μm or less. Sacrificial release layer 240 is composed of an organic material or another suitable material that decomposes or burns in response to a laser beam being applied to the material. Sacrificial release layer 240 may also be composed of a material that decomposes in response to freezing.

Figure 13:
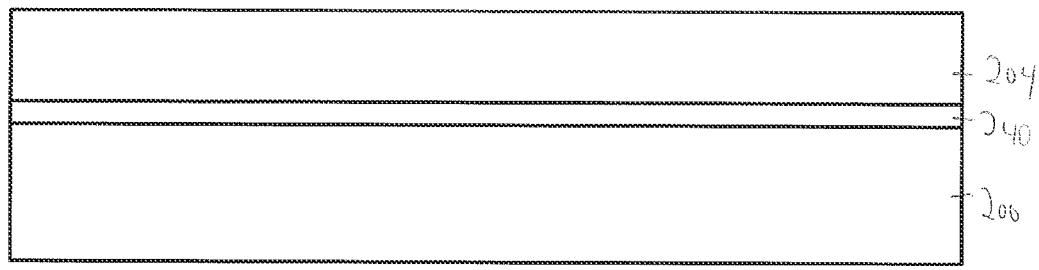
FIG. 13 illustrates a cross-sectional view of one embodiment of the wafer carrier, the sacrificial release material layer, and a dielectric material layer.

FIG. 13 illustrates a cross-sectional view of one embodiment of wafer carrier 200, sacrificial release material layer 240, and a dielectric material layer 204. In this embodiment, dielectric material layer 204 is applied to sacrificial release material layer 240. In other embodiments, dielectric material layer 204 is applied to a semiconductor wafer 202a as previously described and illustrated with reference to FIG. 3B instead of to sacrificial release material layer 240. Dielectric material layer 204 is applied to sacrificial release material layer 240 in a similar manner as dielectric material layer 204 is applied to wafer carrier 200 as previously described and illustrated with reference to FIG. 3A.

Figure 14:
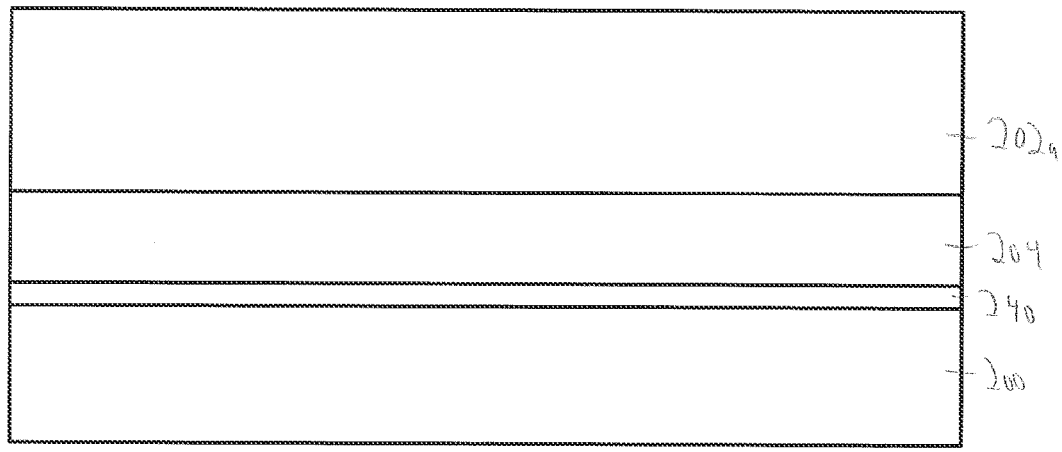
FIG. 14 illustrates a cross-sectional view of one embodiment of the wafer carrier bonded to a semiconductor wafer via the dielectric material layer.

FIG. 14 illustrates a cross-sectional view of one embodiment of wafer carrier 200 bonded to a semiconductor wafer 202a via dielectric material layer 204. Semiconductor wafer 202a is bonded to wafer carrier 200 by applying pressure and heat to semiconductor wafer 202a, wafer carrier 200, sacrificial release layer 240, and dielectric material layer 204 in a similar manner as previously described and illustrated with reference to FIG. 4. In one embodiment, semiconductor wafer 202a is bonded to wafer carrier 200 in a vacuum.

Figure 15:
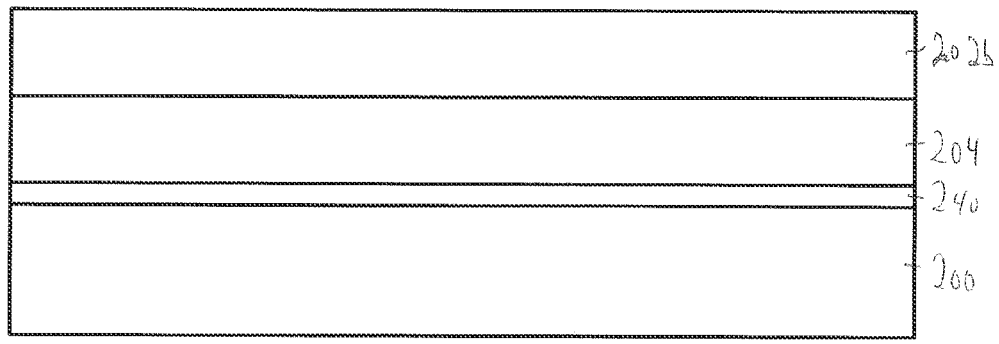
FIG. 15 illustrates a cross-sectional view of one embodiment of the semiconductor wafer bonded to the wafer carrier after processing.

FIG. 15 illustrates a cross-sectional view of one embodiment of semiconductor wafer 202b bonded to wafer carrier 200 after processing. The second side of wafer 202a is processed to provide processed wafer 202b as previously described and illustrated with reference to FIG. 5.

Figure 16:
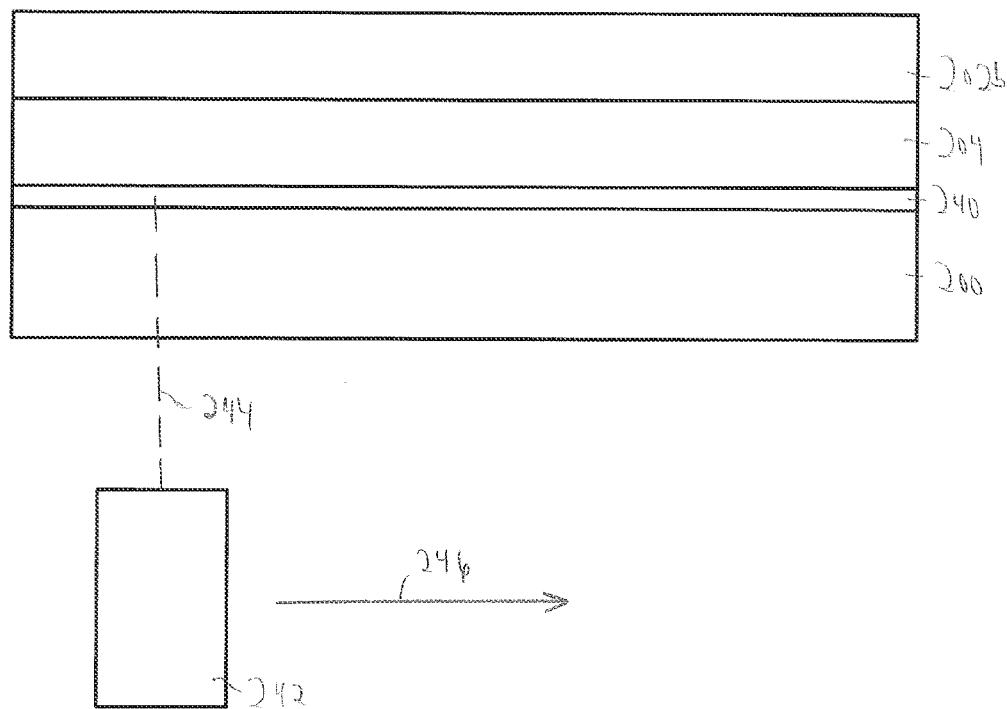
FIG. 16 illustrates a cross-sectional view of one embodiment of removing the wafer carrier by decomposing the sacrificial release material layer.

FIG. 16 illustrates a cross-sectional view of one embodiment of removing wafer carrier 200 by decomposing sacrificial release material layer 240 via laser irradiation. Laser beam 244 of laser 242 is focused on sacrificial release material layer 240 and scanned across the sacrificial release material layer as indicated at 246 to burn the sacrificial release material layer. In one example, laser 242 is a YAG laser. By burning sacrificial release material layer 240, wafer carrier 200 is released from dielectric material layer 204 to provide semiconductor wafer 202b and dielectric material layer 204 as previously described and illustrated with reference to FIG. 6. In other embodiments, sacrificial release material layer 240 is decomposed using another suitable process, such as by freezing sacrificial release material layer 240. After releasing wafer carrier 200 from dielectric material layer 204, wafer carrier 200 may be cleaned and reused. Dielectric material layer 204 may be cleaned to remove any sacrificial release material remaining on dielectric material layer 204 after wafer carrier 200 is removed.

The followings FIGS. 17-24 illustrate another embodiment of a method for fabricating a semiconductor device, such as semiconductor device 110 or 120 previously described and illustrated with reference to FIGS. 1B and 1C, respectively.

Figure 17:
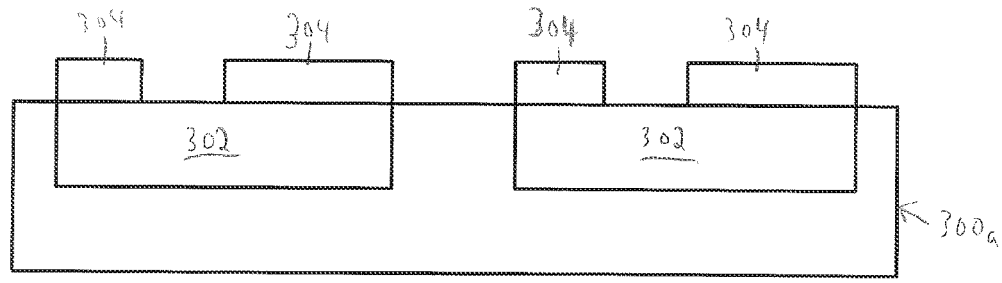
FIG. 17 illustrates a cross-sectional view of one embodiment of a semiconductor wafer including metal contacts electrically coupled to active areas of the semiconductor wafer.

FIG. 17 illustrates a cross-sectional view of one embodiment of a semiconductor wafer 300a including metal contacts 304 electrically coupled to active areas 302 of the semiconductor wafer. In one example, metal contacts 304 are power Cu for power semiconductor devices to be fabricated from semiconductor wafer 300a. In one example, the first side of semiconductor wafer 300a has a topology greater than 20 μm thick due to metal contacts 304 and/or other features formed on the first side of semiconductor wafer 300a.

Figure 18:
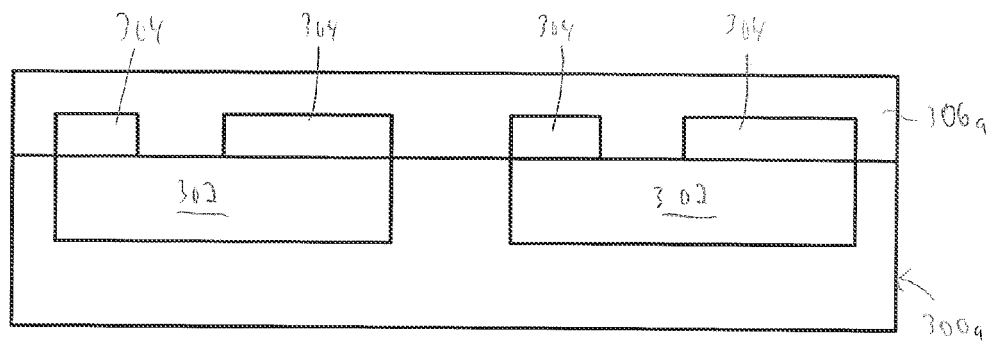
FIG. 18 illustrates a cross-sectional view of one embodiment of the semiconductor wafer and a dielectric material layer.

FIG. 18 illustrates a cross-sectional view of one embodiment of semiconductor wafer 300a and a dielectric material layer 306a. In this embodiment, dielectric material layer 306a is applied to semiconductor wafer 300a. In other embodiments, dielectric material layer 306a is applied to a wafer carrier 200 as previously described and illustrated with reference to FIG. 3A instead of to semiconductor wafer 300a. Dielectric material layer 306a is applied to semiconductor wafer 300a in a similar manner as dielectric material layer 204 is applied to semiconductor wafer 202a as previously described and illustrated with reference to FIG. 3B.

Figure 19:
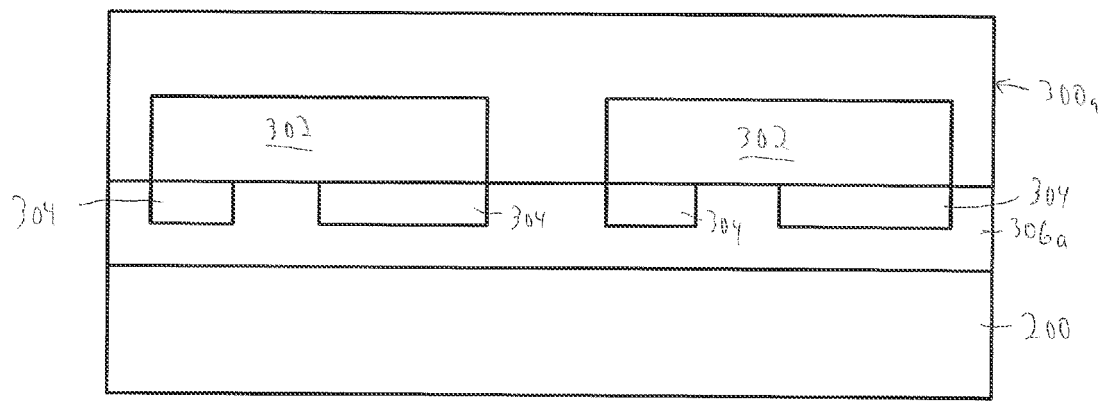
FIG. 19 illustrates a cross-sectional view of one embodiment of the semiconductor wafer bonded to a wafer carrier via the dielectric material layer.

FIG. 19 illustrates a cross-sectional view of one embodiment of semiconductor wafer 300a bonded to a wafer carrier 200 via dielectric material layer 306a. Semiconductor wafer 300a is bonded to wafer carrier 200 by applying pressure and heat to semiconductor wafer 300a, wafer carrier 200, and dielectric material layer 306a in a similar manner as previously described and illustrated with reference to FIG. 4. In one embodiment, semiconductor wafer 300a is bonded to wafer carrier 200 in a vacuum.

Figure 20:
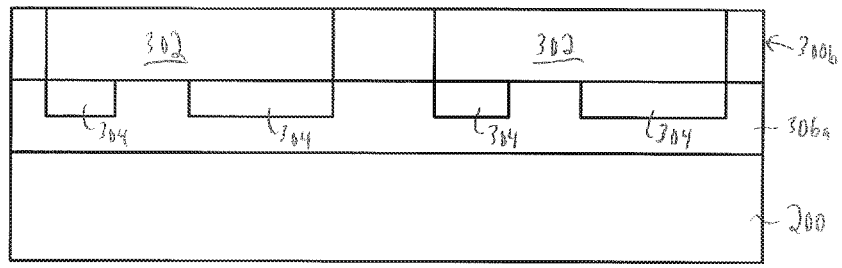
FIG. 20 illustrates a cross-sectional view of one embodiment of the semiconductor wafer bonded to the wafer carrier after processing.

FIG. 20 illustrates a cross-sectional view of one embodiment of semiconductor wafer 300b bonded to wafer carrier 200 after processing. The second side of wafer 300a is processed to provide processed wafer 300b in a similar manner as previously described and illustrated with reference to FIG. 5. In this embodiment, the second side of the semiconductor wafer is thinned by grinding, CMP, or other suitable process to expose active areas 302 of the semiconductor wafer.

Figure 21:
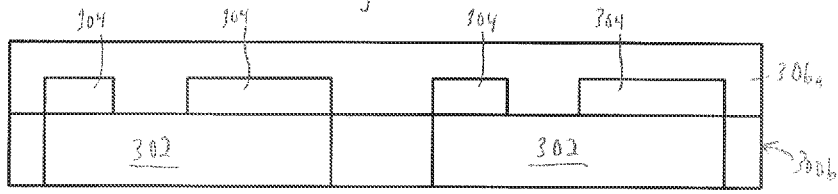
FIG. 21 illustrates a cross-sectional view of one embodiment of the semiconductor wafer and the dielectric material layer after removing the wafer carrier.

FIG. 21 illustrates a cross-sectional view of one embodiment of semiconductor wafer 300b and dielectric material layer 306a after removing wafer carrier 200. After processing, wafer carrier 200 is removed from dielectric material layer 306a in a similar manner as previously described and illustrated with reference to FIG. 6 such that dielectric material layer 306a remains on semiconductor wafer 300b.

Figure 22:
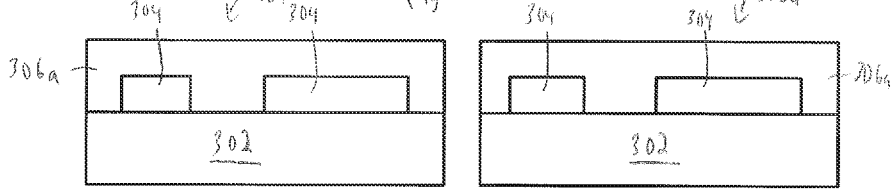
FIG. 22 illustrates a cross-sectional view of one embodiment of a plurality of semiconductor devices including a dielectric material layer after singulation.

FIG. 22 illustrates a cross-sectional view of one embodiment of a plurality of semiconductor devices 310a including a dielectric material layer 306a after singulation. Semiconductor wafer 300b is singulated to provide a plurality of semiconductor devices 310a including a semiconductor chip 302 and a dielectric material layer 306a on the semiconductor chip. Semiconductor wafer 300b is singulated to provide semiconductor devices 310a by sawing, laser cutting, or other suitable process.

Figure 23:
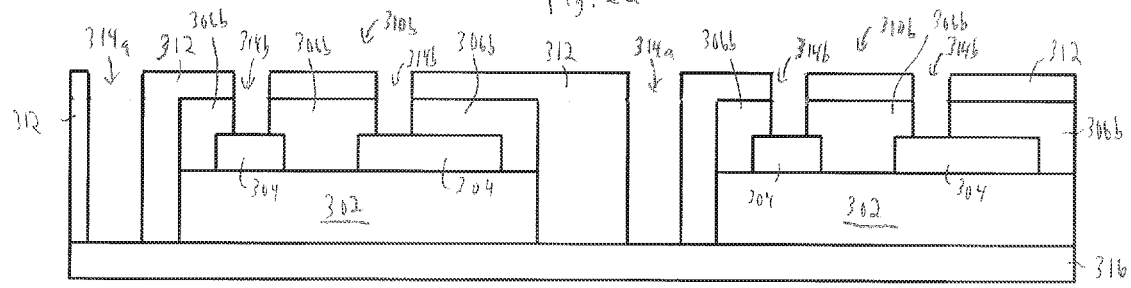
FIG. 23 illustrates a cross-sectional view of one embodiment of an array of semiconductor devices after attaching the semiconductor devices to a device carrier and structuring the dielectric material layer.

FIG. 23 illustrates a cross-sectional view of one embodiment of an array of semiconductor devices 310b after attaching semiconductor devices 310a to a device carrier 316 and structuring dielectric material layer 306a. Semiconductor devices 310a are attached to a device carrier 316, such as a leadframe, metal carrier, or other suitable device carrier. In one example, device carrier 316 is a power Cu layer for a power semiconductor device having a vertical current path. A dielectric material is applied over the array of semiconductor devices 310b and device carrier 316 and structured to provide dielectric material layer 312. Dielectric material layer 312 may be composed of the same dielectric material as dielectric material layer 306a or a different dielectric material. Dielectric material layer 312 is applied to dielectric material layer 306a and device carrier 316 by spin coating, printing, laminating, encapsulating, or other suitable process based on the selected dielectric material.

Dielectric material layer 312 is structured to provide openings 314a exposing portions of device carrier 316. Dielectric material layer 312 and dielectric material layer 306a are structured to provide openings 314b exposing at least a portion of each metal contact 304 and to provide structured dielectric material layer 306b. In one embodiment, openings 314a and 314b are laser drilled. In other embodiments, openings 314a and 314b are structured using a lithography process or another suitable process.

Figure 24:
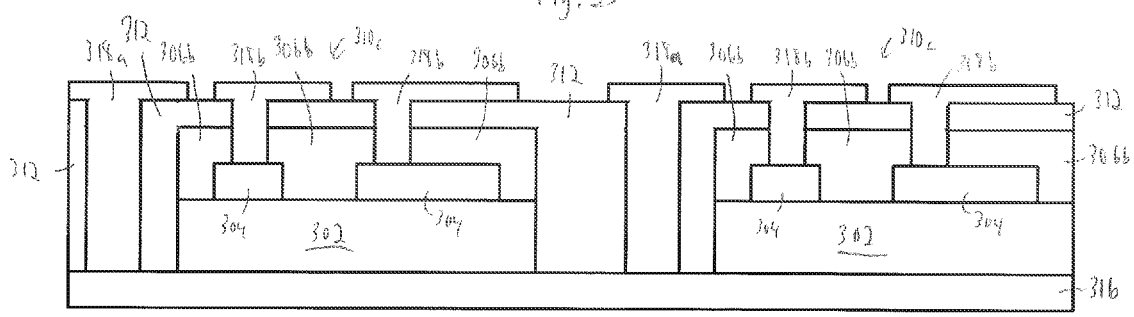
FIG. 24 illustrates a cross-sectional view of one embodiment of the array of semiconductor devices after metallization.

FIG. 24 illustrates a cross-sectional view of one embodiment of an array of semiconductor devices 310c after metallization to provide RDL portions 318a and 318b (collectively referred to as RDL 318). RDL portions 318a are formed in openings 314a and on the surface of dielectric material layer 312 to provide an electrical connection to device carrier 316. RDL portions 318b are formed in openings 314b and on the surface of dielectric material layer 312 to provide an electrical connection to metal contacts 304. RDL 318 is formed by electroplating, sputtering, or other suitable deposition process. In one example, RDL 318 is composed of Cu. After metallization, semiconductor device 310c may be singulated to provide separated semiconductor devices by sawing, laser cutting, or other suitable process.

Embodiments of the disclosure provide a semiconductor device including a dielectric material. The dielectric material is used during the fabrication of the semiconductor device to bond a semiconductor wafer, which is used to fabricate the semiconductor device, to a wafer carrier. The dielectric material has a higher temperature stability than typical temporary adhesive materials, such as in excess of two hours at temperatures above 250° C. or above 350° C. Higher temperature processes may be used when using the dielectric material as a bonding material, thus improving quality, yield, performance, and productivity.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method for manufacturing a semiconductor device, the method comprising:
    providing a carrier;
    providing a semiconductor wafer having a first side and a second side opposite to the first side;
    applying a dielectric material to the carrier or the semiconductor wafer;
    bonding the semiconductor wafer to the carrier via the dielectric material;
    processing the semiconductor wafer;
    removing the carrier from the semiconductor wafer such that the dielectric material remains on the semiconductor wafer to provide a semiconductor device comprising the dielectric material; and
    structuring the dielectric material after removing the carrier from the semiconductor wafer.

2. The method of claim 1, wherein applying the dielectric material comprises applying the dielectric material to the first side of the semiconductor wafer, and
    wherein processing the semiconductor wafer comprises processing the second side of the semiconductor wafer.

3. The method of claim 2, wherein the first side of the semiconductor wafer comprises the frontside of the semiconductor wafer and the second side of the semiconductor wafer comprises the backside of the semiconductor wafer.

4. The method of claim 1, wherein the processing includes processing at a temperature exceeding 300° C.

5. The method of claim 1, wherein the dielectric material comprises a polymer, epoxy, silicone, polyimide, cyanester, or bismalinimide (BMI).

6. The method of claim 1, wherein applying the dielectric material comprises spin coating, printing, laminating, transfer molding, or compression molding.

7. The method of claim 1, wherein the carrier comprises a glass carrier, a semiconductor carrier, a resin carrier, a ceramic carrier, or a metal carrier.

8. The method of claim 1, wherein the processing comprises thinning the semiconductor wafer to have a thickness less than 250 μm.

9. The method of claim 1, wherein removing the carrier from the semiconductor wafer comprises mechanically debonding the carrier from the semiconductor wafer, chemically debonding the carrier from the semiconductor wafer, grinding the carrier to remove the carrier from the semiconductor wafer, or debonding the carrier from the semiconductor wafer via laser irradiation.

10. A method for wafer level processing, the method comprising:
   providing a carrier;
   providing a semiconductor wafer having a first side and a second side opposite to the first side;
   applying a dielectric material to the carrier or the semiconductor wafer;
   bonding the semiconductor wafer to the carrier via the dielectric material;
   processing the semiconductor wafer;
   removing the carrier from the dielectric material;
   singulating the semiconductor wafer to provide a plurality of semiconductor devices, each semiconductor device including the dielectric material used to bond the semiconductor wafer to the carrier; and
   structuring the dielectric material after removing the carrier from the dielectric material.

11. The method of claim 10, wherein applying the dielectric material comprises applying the dielectric material to the second side of the semiconductor wafer, and
   wherein processing the semiconductor wafer comprises processing the first side of the semiconductor wafer.

12. The method of claim 11, wherein the first side of the semiconductor wafer comprises the frontside of the semiconductor wafer and the second side of the semiconductor wafer comprises the backside of the semiconductor wafer.

13. The method of claim 10, wherein singulating the semiconductor wafer comprises singulating the semiconductor wafer with the carrier bonded to the dielectric material, and
   wherein removing the carrier from the dielectric material comprises removing each semiconductor device from the carrier after singulation.

14. The method of claim 10, wherein bonding the semiconductor wafer to the carrier comprises applying pressure and heat to the carrier and the semiconductor wafer.

15. The method of claim 10, wherein bonding the semiconductor wafer to the carrier comprises bonding the semiconductor wafer to the carrier in a vacuum.

16. The method of claim 10, further comprising:
   baking the dielectric material after application to modify the consistency of the dielectric material prior to bonding the semiconductor wafer to the carrier.

17. The method of claim 10, wherein applying the dielectric material comprises applying a thermally conductive insulating material.

18. The method of claim 10, wherein providing a semiconductor wafer comprises providing a semiconductor wafer having a topology greater than 20 μm thick.

19. The method of claim 10, further comprising:
   applying a redistribution layer over the structured dielectric material.

20. The method of claim 10, wherein the processing comprises metallization.

21. A method for manufacturing a semiconductor device, the method comprising:
   applying a sacrificial release material to a glass carrier;
   applying a dielectric material to the sacrificial release material or a first side of a semiconductor wafer;
   bonding the semiconductor wafer to the carrier via the dielectric material such that the sacrificial release material directly contacts the dielectric material;
   processing a second side of the semiconductor wafer, the second side opposite to the first side; and
   decomposing the sacrificial release material to release the carrier from the semiconductor wafer such that the dielectric material remains on the semiconductor wafer to provide a semiconductor device comprising the dielectric material.

22. The method of claim 21, further comprising:
   reusing the carrier after removing the carrier from the semiconductor wafer.

\* \* \* \* \*